United States Patent [19]

Bourg et al.

[11] Patent Number: 5,387,867
[45] Date of Patent: Feb. 7, 1995

[54] PULSED LOW FREQUENCY EPR SPECTROMETER AND IMAGER

[75] Inventors: John Bourg, Bethesda; James Mitchell, Damascus; Mark Mirotznik, Silver Spring; Bradley Roth, Kensington, all of Md.; Sankaran Subramanian, Madras; Murali Cherukuri, Rockville, Md.; Paul G. Zablocky, Alexandria, Va.

[73] Assignee: The United States of America as represented by the Dept. of Health and Human Services, Washington, D.C.

[21] Appl. No.: 97,811

[22] Filed: Jul. 26, 1993

[51] Int. Cl.[6] .................................................. G01R 33/20
[52] U.S. Cl. .................................................. 324/316
[58] Field of Search ............... 324/316, 318, 300, 322; 128/653.5; 333/219

[56] References Cited

U.S. PATENT DOCUMENTS

| | | | |
|---|---|---|---|
| 3,281,842 | 10/1966 | Cerar et al. | 343/17.2 |
| 3,355,734 | 11/1967 | Albanese | 343/14 |
| 3,577,145 | 5/1971 | Worden | 324/300 |
| 3,593,159 | 7/1971 | Kaplan | 370/63 |
| 3,729,738 | 4/1973 | Cross et al. | 343/5 SA |
| 3,829,760 | 8/1974 | Bozanic et al. | 343/5 R |
| 4,017,855 | 5/1977 | Buck et al. | 324/300 |
| 4,309,703 | 1/1982 | Blahut | 343/17.2 PC |
| 4,639,671 | 1/1987 | Macovski | 324/309 |
| 4,676,105 | 6/1987 | Matzuk | 73/602 |
| 4,704,737 | 11/1987 | Estrick et al. | 455/226 |
| 4,714,886 | 12/1987 | Halpern | 324/316 |
| 4,733,189 | 3/1988 | Punchard et al. | 324/318 |
| 4,812,763 | 3/1989 | Schmalbein | 324/316 |
| 4,861,158 | 8/1989 | Breen | 356/5 |
| 4,899,109 | 2/1990 | Tropp et al. | 324/320 |
| 4,901,082 | 2/1990 | Schreiber et al. | 342/89 |
| 4,922,256 | 5/1990 | Brandstetter | 342/132 |
| 4,994,740 | 2/1991 | Skudera, Jr. et al. | 324/77 B |
| 5,105,294 | 4/1992 | Degura et al. | 359/154 |
| 5,113,278 | 5/1992 | Degura et al. | 359/154 |
| 5,126,671 | 6/1992 | Bodenhausen et al. | 324/309 |
| 5,128,681 | 7/1992 | McGroary et al. | 342/132 |
| 5,149,946 | 9/1992 | Jerome et al. | 235/439 |

OTHER PUBLICATIONS

"Three Dimensional in Vivo ESR Imaging in Rats," Alecci, et al, *Magnetic Resonance Imaging,* vol. 8, No. 1, 59-63 (1990).

"A Radiofrequency ESR Spectrometer for in Vivo Imaging," Brivati, et al., *Journal of Magnetic Resonance,* 92, 480-489 (1991).

"Atomic Memory," Brewer, et al., *Scientific American,* Dec. 1994, 50-57.

*Primary Examiner*—Kenneth A. Wieder
*Assistant Examiner*—Raymond Y. Mah
*Attorney, Agent, or Firm*—Townsend and Townsend Khourie and Crew

[57] ABSTRACT

An EPR imager and spectrometer includes pulse generating system for generating broadband pulses having an RF carrier frequency that is not highly absorbed by biological samples. The pulse generating system includes up and down chirp convertors for frequency modulating a carrier frequency pulse and compressing the frequency modulated pulse to form a broadband excitation pulse of high energy. Such a machine could form the basis of a clinical imaging device capable of high sensitivity to free radical species in human patients.

10 Claims, 3 Drawing Sheets

PULSED LOW FREQUENCY EPR SPECTROMETER AND IMAGER

BACKGROUND OF THE INVENTION

Electron Paramagnetic Resonance (EPR) spectroscopy and imaging techniques are being increasingly applied to study biological (aqueous) systems. Exciting possibilities for developing new, non-invasive diagnostic tools have stimulated interest in EPR techniques.

One property of biological systems is that electromagnetic radiation above about 500 MHz is strongly absorbed due to dielectric effects in the aqueous medium. Accordingly, there has been a spurt in attempts to develop instrumentation for the study of paramagnetic systems at radiofrequencies (<500 MHz). Large volume loop-gap, bird-cage and other classes of resonators which are routinely used in NMR spectroscopy and imaging can be directly employed for both constant wave (CW) and pulsed RF EPR spectroscopy and imaging. The relatively low Q and high filling factors are ideally suited for time domain experiments.

Existing RF EPR imaging utilize CW techniques and thus the excitation signal is inherently a narrow band width signal. However, EPR imaging requires a non-homogenous internal magnetic field which spreads the resonance frequency over about an 100 MHz band width. As is well-known from Fourier analysis, a carrier frequency of 300 MHz requires a 10 ns pulse envelope to cover 100 MHz. However, the shortest reasonable pulse duration RF spectroscopy is approximately 25 ns, resulting in only about a 40 MHz frequency spread, due to rise time limitations of the pulse and diode switching. Short duration pulses are also required to perform very fast signal averaging in the time domain.

SUMMARY OF THE INVENTION

The present invention is an improved system for providing excitation radiation for stimulating EPR in a biological system. An RF carrier signal pulse is generated and provided to a frequency modulating unit to generate a broadband pulse of increased bandwidth. The broadband pulse is provided to pulse compression unit to generate a broadband compressed pulse having a large amplitude and short time duration. This broadband pulse is coupled to a resonator to stimulate EPR in the sample. The carrier frequency is selected to have low absorption in the biological sample. Such a machine could form the basis of a clinical imaging device capable of high sensitivity to free radical species in human patients.

According to another aspect of the invention, a pulse generating network includes a plurality of parallel paths, each including serially connected frequency modulating and matched filter pulse compression units. The pulse generating network has an input coupled to receive an RF carrier signal and an output coupled to the resonator.

According to a further aspect of the invention, the resonator includes a cylindrical resonator body and a conducting cap adjustably spaced from the body. The resonant FR frequency is selected by adjusting the spacing between the body and the cap.

Additional advantages and features of the invention will be apparent in view of the following detailed description and appended drawings.

DESCRIPTION OF THE SPECIFIC EMBODIMENTS

Figure 1:
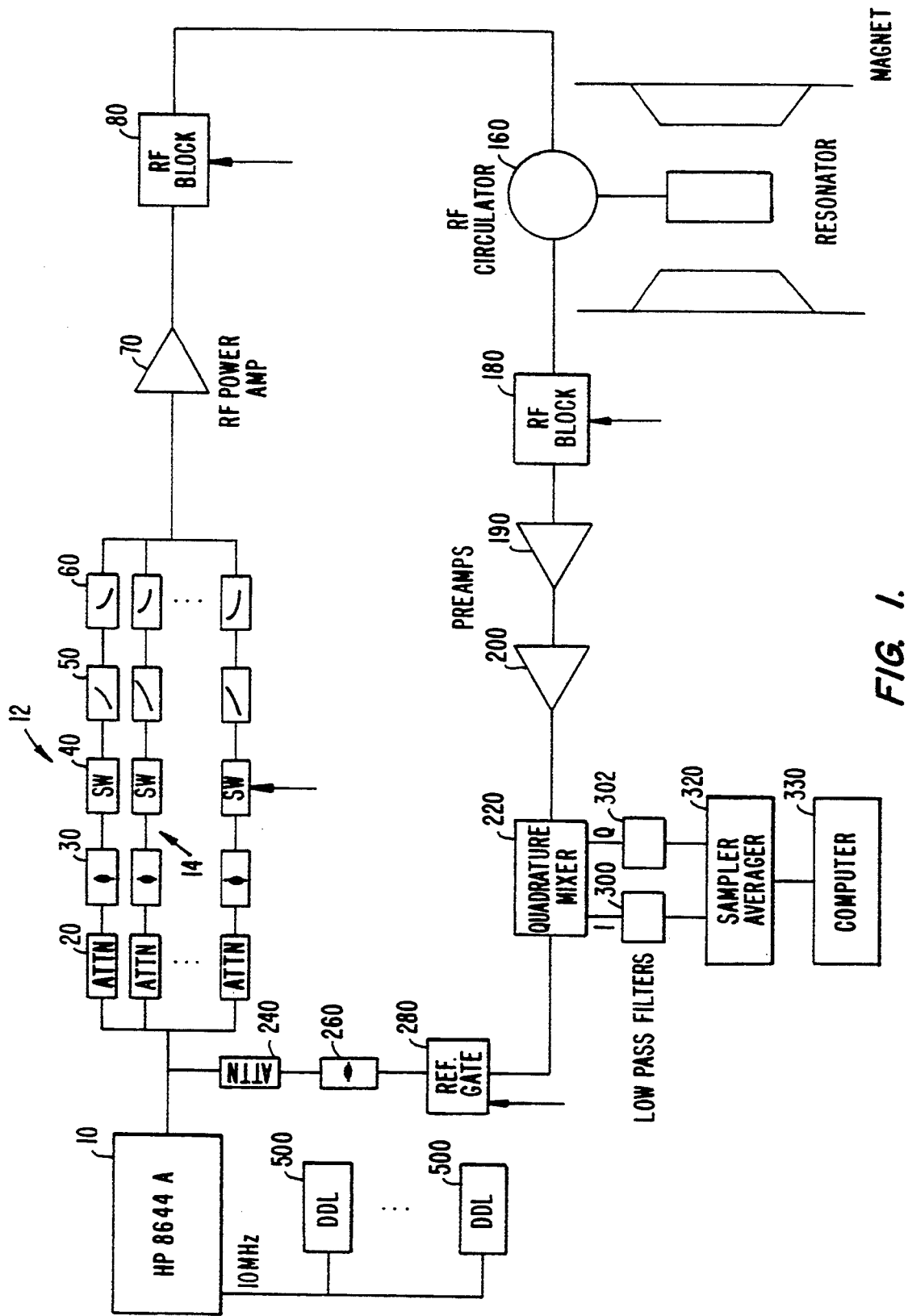
FIG. 1 is a block diagram of the RF pulse generation system.

FIG. 1 is a block diagram of a preferred embodiment of the invention. In FIG. 1 a frequency generator 10 is coupled to a pulse-generating structure 12. The pulse generating-structure 12 is formed by a set of parallel paths 14. Each parallel path is formed by an RF attenuator 20, phase shifter 30, dual PIN switch 40, Chirp Up Convertor 50, and Chirp Down Converter 60. An RF power amplifier 70 has its input coupled to the output of the pulse-generating structure and an output coupled to an output RF blocking circuit 80 which includes a timing input.

An RF circulator 160 has ports coupled to the output of the output RF blocking circuit 80, a resonator 170, and the input of an input RF blocking circuit 180.

The output of the output RF blocking circuit 180 is coupled, via RF preamps 190 and 200, to the signal input of a quadrature mixer 220. The output of the frequency generator 10 is coupled to the reference input of the quadrature mixer 220 through an RF attenuator 240, a phase shifter 260, and a reference gate 280.

The I and Q outputs of the quadrature mixer 220 are coupled through low pass filters 300 and 302 to a sampler averager 320. A computer 330 receives the output of the sample averager 320 and performs signal processing functions.

The operation of the embodiment depicted in FIG. 1 will now be described. A carrier signal at about 300 MHz is generated by the frequency generator 10 and provided to the input of the pulse-generating network 12. For a particular parallel path 14, the RF attenuator 20 and phase shifter 30 adjust the amplitude and phase of the carrier signal to desired values. The switch 40 is controlled to output a carrier frequency pulsed to the input of the serially connected Up and Down Chirp Converters 50 and 60.

The principles of linear FM pulse compression are well-known in radar applications and are described at pages 422–426 of the book by Skolnik, M. I., entitled *Introduction to Radar Systems*, Second Edition, McGraw-Hill (1980). These principles are illustrated in FIGS. 2A–2D. A pulse 400 of the carrier signal of duration T is modulated by linear frequency ramp 420 of width B ($f_2-f_1$). The shape of the Up Chirp pulse in the time domain 430 is depicted in FIG. 2C. The pulse is called a chirp because an increasing frequency audio pulse sounds like a chirp.

Figure 2A:
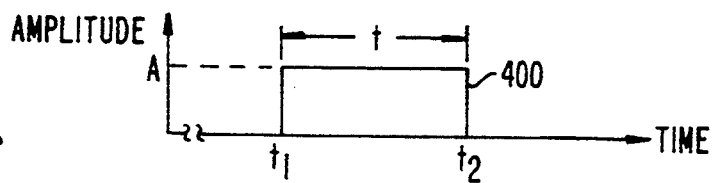
FIGS. 2A–2D are a series of graphs illustrating the principles of FM pulse compression.
Figure 2B:
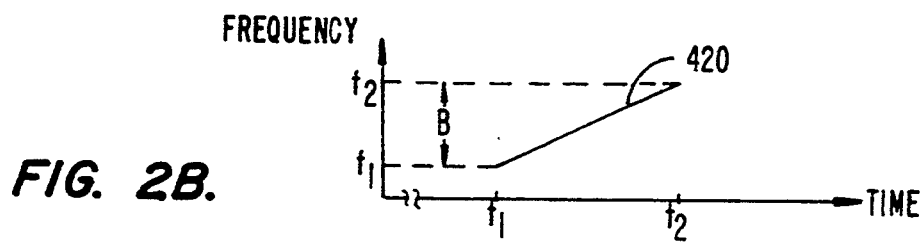
Figure 2C:
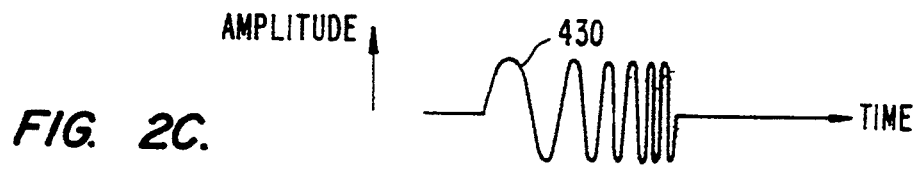
Figure 2D:
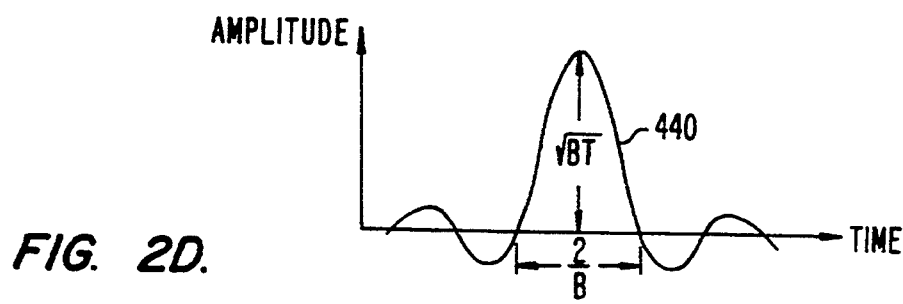

The Up Chirp pulse 430 is passed through a pulse compression filter, designed so that the velocity propagation through the filter is proportional to frequency, to form a compressed pulse 440 depicted in FIG. 2D. By energy conservation the compressed pulse 440 will have increased amplitude and cover the full range of frequencies B. Additionally, the width of the pulse in the time domain decreases for increasing B.

Referring back to FIG. 1, the Up Chirp Converter 50 and Down Chirp Converter 60 respectively perform the linear frequency modulation and pulse compression functions depicted in FIGS. 2B and 2D. As described in the above-cited book, in radar systems typically the uncompressed frequency modulated carrier signal pulse is transmitted due to gain limitations in the transmitter and the reflected, received signal is processed for pulse compression to improve signal-to-noise ratio and improve distance resolution.

In the present system, the output of the signal-generating network transmitted to the resonator is the compressed pulse 440 depicted in FIG. 2D. This pulse is utilized to provide broadband excitation and to improve time resolution. This is especially important because the different frequency components in the compressed pulse have a constant phase shift.

In the preferred embodiment the Up Chirp Converter 50 and Down Chirp Convertor 60 are realized as surface acoustic wave (SAW) delay lines. These devices are well-known and their properties are described in the above-referenced book.

The output signals from the resonator 170 are detected in the quadrature mixer utilizing well-known standard techniques.

Referring again to FIG. 1, the function of the RF attenuator 20, phase shifter 20, and switch 40 in each parallel path 14 may alternatively be performed by digital delay line pulse generators (DDLs) 500. As indicated schematically in the drawings, the output of each DDL 500 is coupled to the input of an Up Chirp Converter in a corresponding parallel path 14.

The various parallel paths 14 in the pulse-generating network 12 allow for the generation of compressed excitation pulses having precise time and phase relationships. For example, it is not feasible to independently generate the precise relationships between the two Carr-Purcell pulses required to observe the spin-echo effect. Further, highly accurate quadrature detection requires a set of Cyclops pulses to compensate for inaccuracies in phase relationships. The various parallel paths of the pulse-generating network allow a pair of Carr-Purcell pulses or the pulses in the Cyclops sequence to derived on the parallel paths 14 from a single carrier frequency pulse received at the input of the pulse-generating network 12.

Figure 3:
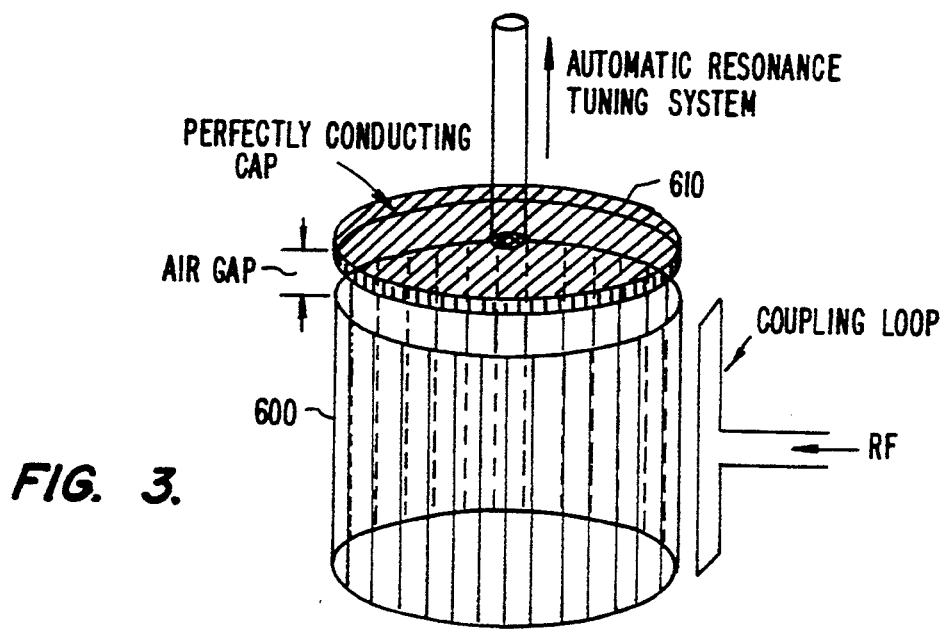
FIG. 3 is a block diagram of the resonator.

FIG. 3 depicts a modified birdcage resonator 600 that is utilized in the preferred embodiment of the invention. In FIG. 3, the lumped capacitive elements incorporated in standard device used to a achieve resonance is replaced with a conducting cap 610. The spacing between the resonator 600 and cap 610 can be automatically adjusted until the resonator is tuned to the desired resonant frequency.

This modified birdcage design offers the following advantages over standard EPR resonator designs:

1. It produces a nearly homogeneous internal magnetic field in the TM10 mode.
2. The direction of the magnetic field is in the transverse direction to accommodate longitudinal static DC field.

The resonator design allows easy access to light sources and lasers for in situ radiation chemistry.

Figure 4:
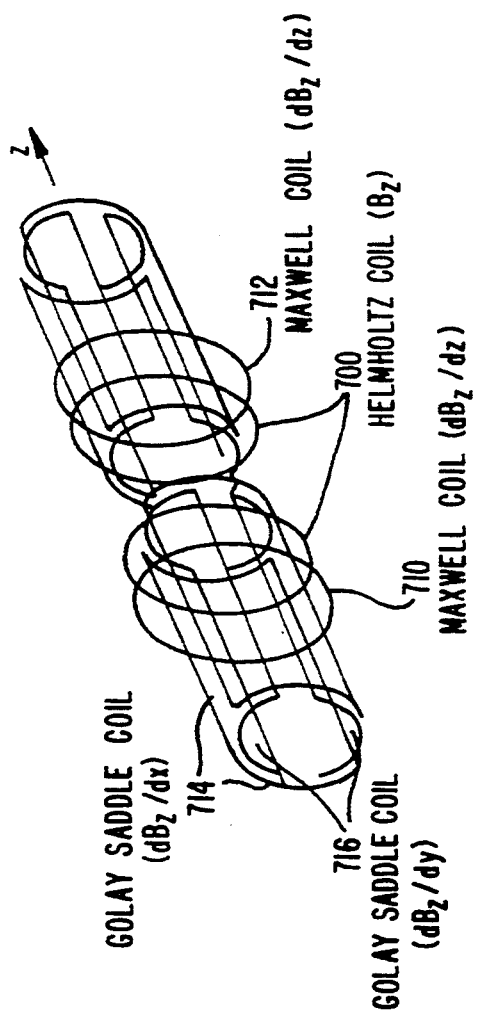
FIG. 4 is schematic diagram of the magnetic coils.
Figure 4:
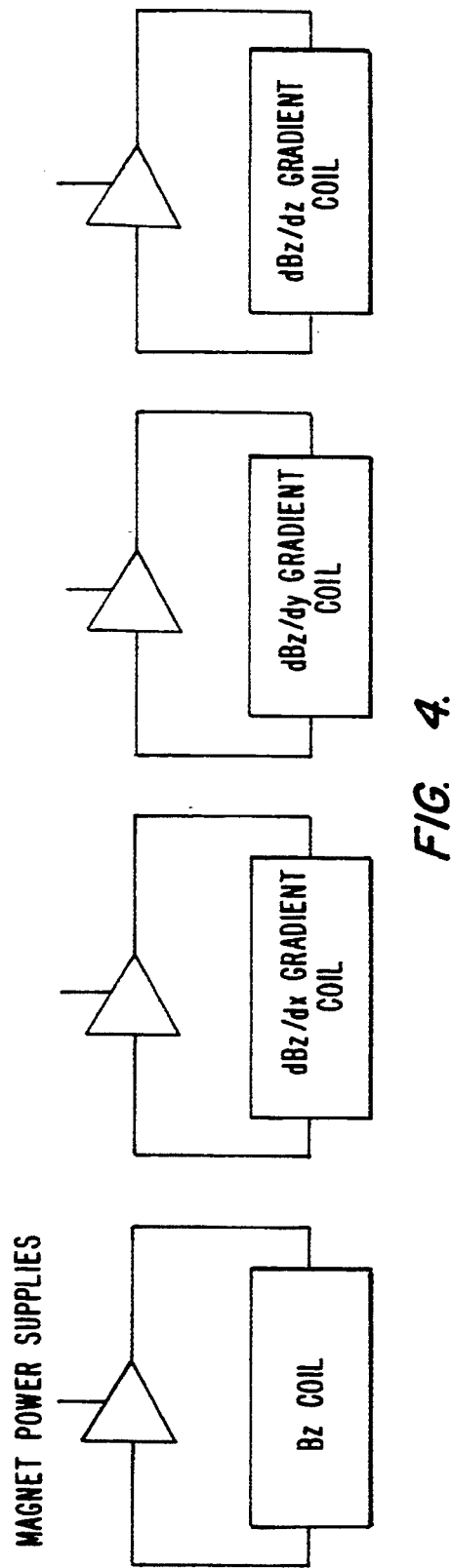

FIG. 4 depicts the magnetic coil design utilized in the preferred embodiment of the invention. In FIG. 4 a set of coils is utilized to produce gradients of the z-component of the magnetic field in the x, y, and z directions and a uniform field in the z direction.

In FIG. 4, a Helmholtz coil pair 700 generates the uniform DC field in the z direction. A Maxwell coil pair 710 and 712 generates the gradient field in the z direction and two sets of Golay saddle coils 714 and 716 generate the z-component gradient fields in the x and y directions.

The gradient coils are similar to those used in magnetic resonance imagers but carry considerably more current to produce the large magnetic field gradients (100 G/cm) required for EPR imaging. A unique aspect of the coil design of FIG. 4 is that the uniform field in the z direction has a similar strength to the gradient fields. In contrast, in NMR imaging systems the uniform field in the z direction is much larger than the gradient fields.

This small uniform field is required to keep the operating frequency of the EPR imager low enough (circ 300 MHz) to allow the RF carrier signal to penetrate biological (aqueous) tissue without serious loss due to absorption. The large gradient fields are needed to provide sufficient spatial resolution (circa 1 mm) given the typical line widths of EPR spectra. The requirement of a small uniform field requires that the spatial homogeneity of the uniform magnetic field is much less than for NMR imaging. Thus, a simple Helmholtz pair should be sufficient for generating the uniform field.

As depicted in FIG. 4, each coil has its own power supply. The gradient coils draw large current and because of heat dissipation require water cooling. The power supplies are controlled by the computer 330.

The invention has now been described with reference to the preferred embodiments. Modifications and substitutions will now be apparent to persons of skill in the art. For example, the Up Chirp and Down Chirp convertors have been implemented by SAW delay lines. However, these convertors can be implemented utilizing other digital and analog techniques well-known in the art. Similarly, alternative systems for providing the carrier frequency pulses are well-known. Accordingly, it is not intended to limit the invention except as provided by the appended claims.

What is claimed is:

1. An improved excitation system for an electron paramagnetic resonance system having a resonator for receiving excitation signals and containing an aqueous sample that includes electrons which resonate at a selected RF resonant frequency that is not highly absorbed by the aqueous sample, said system including:
   means for supplying a radio frequency (RF) carrier signal having a frequency about equal to said selected RF resonant frequency;
   pulse forming means, having an input coupled to receive said RF carrier signal, for forming an RF carrier signal pulse;
   frequency modulating means, coupled to receive said RF carrier signal pulse, for frequency modulating said RF carrier frequency pulse to form a broadband pulse having a predetermined bandwidth;
   pulse compression means, coupled to receive said broadband pulse, for compressing said broadband pulse to form a compressed broadband pulse having a shorter time duration and substantially the same bandwidth as said broadband pulse; and
   means for coupling said compressed pulse to said resonator so that said aqueous sample is excited by said compressed pulse.

2. The system of claim 1 wherein said pulse forming means comprises:
   an RF attenuator and phase shifter coupled to receive said RF carrier signal pulse; and a switch for starting and terminating said RF carrier signal pulse.

3. The system in claim 1 wherein said pulse forming means comprises:
a digital delay line pulse generator for starting and terminating said RF carrier signal pulse.

4. The system of claim 1 wherein:
said frequency modulating and pulse compression means are surface acoustic wave delay lines.

5. The system of claim 1 wherein said resonator comprises:
a substantially cylindrical resonator body; and
a conducting cap, adjustably spaced from said resonator body, for selecting the RF resonant frequency of said resonator.

6. An improved excitation system for an electron paramagnetic resonance system having a resonator for receiving excitation signals and containing an aqueous sample that includes electrons which resonate at a selected RF resonant frequency that is not highly absorbed by the aqueous sample, said system including:
means for supplying a radio frequency (RF) carrier signal having a frequency about equal to said selected RF resonant frequency;
a pulse generating network, coupled to receive said RF carrier signal, including a plurality of parallel paths, the pulse generating network for generating separate compressed excitation pulses, having selected timing and phase relationships, along each parallel path;
means for coupling said separate compressed excitation pulses to said resonator so that said aqueous sample is excited by said compressed pulses;
wherein each of said parallel paths comprises:
serially connected pulse forming means for forming an rf carrier signal pulse broadband frequency modulating means for frequency modulating said rf carrier pulse to form a broadband pulse having a predetermined bandwidth, and matched filter pulse compression means for compressing said broadband pulse to generate one of said compressed pulses.

7. The system of claim 6 wherein each of said parallel paths further comprises:
an RF attenuator and phase shifter coupled to receive said RF carrier signal; and
a switch for starting and terminating an RF carrier signal pulse.

8. The system in claim 6 further comprising:
a digital delay line pulse generator, having an input coupled to said means for supplying and an output coupled to said broadband frequency modulating means, for starting and terminating an RF carrier signal pulse.

9. The system of claim 6 wherein:
said frequency modulating and pulse compression means are surface acoustic wave delay lines.

10. The system of claim 6 wherein said resonator comprises:
a substantially cylindrical resonator body; and
a conducting cap, adjustably spaced from said resonator body, for selecting the RF resonant frequency of said resonator.

* * * * *

UNITED STATES PATENT AND TRADEMARK OFFICE
CERTIFICATE OF CORRECTION

PATENT NO. : 5,387,867
DATED : February 7, 1995
INVENTOR(S) : Bourg, et al.

It is certified that error appears in the above-indentified patent and that said Letters Patent is hereby corrected as shown below:

On title page, item [75] the following inventor information should be added after the last-named inventor:

> Thomas J. Pohida, Monrovia, MD; Paul D. Smith, Annapolis, MD; Walter S. Friauf, Bethesda, MD; Rolf Gottfried Tschudin, Kensington, MD Signed and Sealed this Sixth Day of June, 1995

Attest:

BRUCE LEHMAN

Attesting Officer

Commissioner of Patents and Trademarks